(12) United States Patent
Ikeda et al.

(10) Patent No.: US 7,064,471 B2
(45) Date of Patent: Jun. 20, 2006

(54) SURFACE ACOUSTIC WAVE DEVICE, METHOD OF MANUFACTURING THE DEVICE, AND ELECTRONIC COMPONENT USING THE DEVICE AND METHOD

(75) Inventors: Kazuo Ikeda, Osaka (JP); Kazunori Nishimura, Kyoto (JP); Yasumichi Murase, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 10/362,209

(22) PCT Filed: Jun. 18, 2002

(86) PCT No.: PCT/JP02/06041

§ 371 (c)(1),
(2), (4) Date: May 13, 2003

(87) PCT Pub. No.: WO03/001666

PCT Pub. Date: Jan. 3, 2003

(65) Prior Publication Data

US 2004/0012302 A1    Jan. 22, 2004

(30) Foreign Application Priority Data

Jun. 21, 2001  (JP) .............................. 2001-187714
Oct. 3, 2001   (JP) .............................. 2001-307256
Nov. 26, 2001  (JP) .............................. 2001-358802

(51) Int. Cl.
*H03H 9/25* (2006.01)

(52) U.S. Cl. .............................. 310/313 D; 310/313 R

(58) Field of Classification Search ............ 310/313 R, 310/313 D
See application file for complete search history.

(56) References Cited

U.S. PATENT DOCUMENTS

| | | | | |
|---|---|---|---|---|
| 4,425,554 A | * | 1/1984 | Morishita et al. ............ 333/195 |
| 5,459,368 A | * | 10/1995 | Onishi et al. ............ 310/313 R |
| 5,619,175 A | * | 4/1997 | Bauregger ................... 333/195 |
| 5,932,950 A | * | 8/1999 | Yamada et al. ........... 310/313 D |
| 6,034,578 A | * | 3/2000 | Fujita et al. ................. 333/193 |
| 6,297,712 B1 | | 10/2001 | Kadota et al. |
| 6,552,631 B1 | * | 4/2003 | Huor ........................... 333/195 |
| 6,552,632 B1 | * | 4/2003 | Inoue et al. ................. 333/195 |
| 2003/0160541 A1 | * | 8/2003 | Ikeda et al. ............. 310/313 D |
| 2004/0075513 A1 | * | 4/2004 | Ikeda et al. ................. 333/193 |

FOREIGN PATENT DOCUMENTS

| | | | | |
|---|---|---|---|---|
| JP | 62-88409 A | * | 4/1987 | ............. 310/313 R |
| JP | 02-070114 | | 3/1990 | |

(Continued)

OTHER PUBLICATIONS

Supplementary European Search Report corresponding to application No. EP 02 73 6147 dated Dec. 15, 2004.

*Primary Examiner*—Thomas M. Dougherty
(74) *Attorney, Agent, or Firm*—RatnerPrestia

(57) ABSTRACT

A surface acoustic wave (SAW) device includes a comb-shaped electrode 2, a reflector 3 and a plurality of auxiliary electrodes 6a and 6b for surrounding the comb-shaped electrode 2 and the reflector 3, which are electrically independent of each other and have different widths locally. The SAW device is capable of efficiently and electrically uniformizing electric charge generated by pyroelectric property of a piezoelectric substrate 1.

11 Claims, 8 Drawing Sheets

FOREIGN PATENT DOCUMENTS

| | | |
|---|---|---|
| JP | 04-021205 | 1/1992 |
| JP | 04-288718 | 10/1992 |
| JP | 05-160664 | 6/1993 |
| JP | 07-303024 | 11/1995 |
| JP | 11-298289 | 10/1999 |
| JP | 2000-13165 | 1/2000 |
| JP | 2000-091872 | 3/2000 |
| TW | 449963 | 8/2001 |

* cited by examiner

SURFACE ACOUSTIC WAVE DEVICE, METHOD OF MANUFACTURING THE DEVICE, AND ELECTRONIC COMPONENT USING THE DEVICE AND METHOD

TECHNICAL FIELD

The present invention relates to a surface acoustic wave (SAW) device, its manufacturing method and an electronic component employing the same.

BACKGROUND ART

In a conventional SAW device, after a metallic thin film has been formed on a whole surface of a piezoelectric substrate, a resist is coated on the metallic thin film and then, a desired electrode pattern is formed in which desired interdigital transducers and grating reflectors are not only surrounded by dicing lines but connected by thin lines through exposure, development and etching. The thus obtained article is cut along the dicing lines into a plurality of the SAW devices.

In this method, once the SAW device has been cut from the piezoelectric substrate, the interdigital transducers and the grating reflectors are electrically separated from each other. Hence, upon application of heat or strain to the SAW device, electric charge is generated by pyroelectric property of the piezoelectric substrate. Thus, if electric charge becomes nonuniform among the electrodes, electric discharge occurs between the confronting interdigital transducers, between the confronting grating reflectors and between the interdigital transducer and the grating reflector, thereby resulting in damage to the electrodes or deterioration of characteristics of the SAW device.

On the other hand, a method for solving this problem is known from Japanese Patent Laid-Open Publication No. 11-298289 (1999). Namely, since inside a dicing line, a short-circuiting thin line of a metallic thin film surrounds an interdigital transducer and a grating reflector and a plurality of thin lines are provided for electrically connecting the short-circuiting thin line of the metallic thin film and the interdigital transducer are provided, generated electric charge is uniformized electrically, so that damage and deterioration of electrical characteristics due to electrostatic discharge are prevented.

However, in this conventional arrangement in which inside the dicing line, the short-circuiting thin line of the metallic thin film surrounds the interdigital transducer and the grating reflector and the thin lines electrically connect the short-circuiting thin line of the metallic thin film and the interdigital transducer, such disadvantages are incurred that since generated electric charge cannot be neutralized and uniformized sufficiently due to rise of impedance between lines in case the generated electric charge is large, in case a distance between the electrodes is short, in case the connected electrodes are far from each other, the line for connecting the short-circuiting thin line of the metallic thin film and the interdigital transducer is thin or in case the connecting line is a meander line or a portion of the connecting line is thinner than the remaining portion of the connecting line, damage to the electrodes and deterioration of electrical characteristics are caused by electrostatic discharge generated between the electrodes.

DISCLOSURE OF INVENTION

The present invention has for its object to provide, with a view to eliminating the drawbacks of prior art, a surface acoustic wave (SAW) device which efficiently uniformizes electric charge generated in a piezoelectric substrate by strain or heat treatment and uniformizes potential even after cutting of the substrate into a plurality of the SAW devices so as to prevent damage to electrodes and deterioration of electrical characteristics, its manufacturing method and an electronic component employing the SAW device.

In order to accomplish this object of the present invention, the present invention has the following arrangements.

In an arrangement of claim 1, a comb-shaped electrode and a reflector are surrounded by a plurality of auxiliary electrodes, which are electrically independent of each other and have different widths locally. By this arrangement, since electric charge generated by heat treatment, etc. can be uniformized efficiently and electrically, local nonuniformity of produced potential is lessened, so that such an effect is gained that breakdown of the device due to electrostatic discharge, etc. can be eliminated.

In an arrangement of claim 2, the auxiliary electrodes are each used as a ground electrode. By this arrangement, if the auxiliary electrodes are connected to a ground of a substrate having the SAW device mounted thereon, etc., an electrically uniform ground having a larger area can be obtained, so that local nonuniformity of produced potential is lessened and thus, such an effect is achieved that breakdown of the device due to electrostatic discharge, etc. can be eliminated.

In an arrangement of claim 3, the auxiliary electrodes are disposed substantially equivalently. By this arrangement, since electric charge generated at respective portions can be uniformized substantially equally and electrically, local nonuniformity of produced potential is lessened, so that such an effect is obtained that breakdown of the device due to electrostatic discharge, etc. can be eliminated.

In an arrangement of claim 4, a beltlike input terminal lead-out electrode and a beltlike output terminal lead-out electrode are each connected to the comb-shaped electrode and an input terminal electrode and an output terminal electrode are, respectively, connected to the input terminal lead-out electrode and the output terminal lead-out electrode. By this arrangement, since electric charge generated at the input terminal lead-out electrode, the output terminal lead-out electrode, the input terminal electrode and the output terminal electrode can be uniformized, local nonuniformity of produced potential is lessened, so that such an effect is gained that breakdown of the device due to electrostatic discharge, etc. can be eliminated.

In an arrangement of claim 5, the input terminal lead-out electrode and the output terminal lead-out electrode confront each other and are made substantially equal in area, while the input terminal electrode and the output terminal electrode confront each other and are made substantially equal in area. By this arrangement, since electric charge generated at an input terminal lead-out electrode portion and an output terminal lead-out electrode portion can be made substantially equal so as to be uniformized electrically, local nonuniformity of produced potential is lessened, so that such an effect is achieved that breakdown of the device due to electrostatic discharge, etc. can be eliminated.

In an arrangement of claim 6, at least a portion of the reflector is electrically connected to the auxiliary electrodes. By this arrangement, since electric charge generated at the reflector can be uniformized over the electrodes as a whole through the auxiliary electrodes, local nonuniformity of produced potential is lessened, so that such an effect is obtained that breakdown of the device due to electrostatic discharge, etc. can be eliminated.

In an arrangement of claim 7, the reflector is electrically connected to each of the auxiliary electrode by a linear or beltlike electrode. By this arrangement, since generated electric charge can be uniformized efficiently, local nonuniformity of produced potential is lessened, so that such an effect is gained that breakdown of the device due to electrostatic discharge, etc. can be eliminated.

In an arrangement of claim 8, the reflector is set in an electrically open state relative to the auxiliary electrodes. By this arrangement, since the auxiliary electrodes are least likely to be influenced by potential change, local nonuniformity of produced potential is lessened, so that such an effect is achieved that breakdown of the device due to electrostatic discharge, etc. can be eliminated.

In an arrangement of claim 9, the reflector is formed by a meander line and is electrically connected to the comb-shaped electrode. By this arrangement, since the reflector and the comb-shaped electrode can be set at an identical potential, local nonuniformity of produced potential is lessened, so that such an effect is obtained that breakdown of the device due to electrostatic discharge, etc. can be eliminated.

A method of claim 10 includes the steps of providing on a piezoelectric substrate at least one set of a comb-shaped electrode, a reflector, a plurality of auxiliary electrodes for surrounding the comb-shaped electrode and the reflector, which are electrically independent of each other and have different widths locally, an input terminal electrode, an input terminal lead-out electrode, an output terminal electrode and an output terminal lead-out electrode and cutting the substrate along portions between neighboring ones of the auxiliary electrodes. By this method, since electric charge generated in the piezoelectric substrate can be uniformized, local nonuniformity of produced potential is lessened, so that such an effect is gained that breakdown of the device due to electrostatic discharge, etc. can be eliminated.

In a method of claim 11, at least an uppermost layer of the input terminal electrode, the output terminal electrode and the auxiliary electrodes is formed by deposition. By this method, such an effect is achieved that connection of these electrodes to an external terminal can be stabilized.

BEST MODE FOR CARRYING OUT THE INVENTION (First Embodiment)

Figure 1:
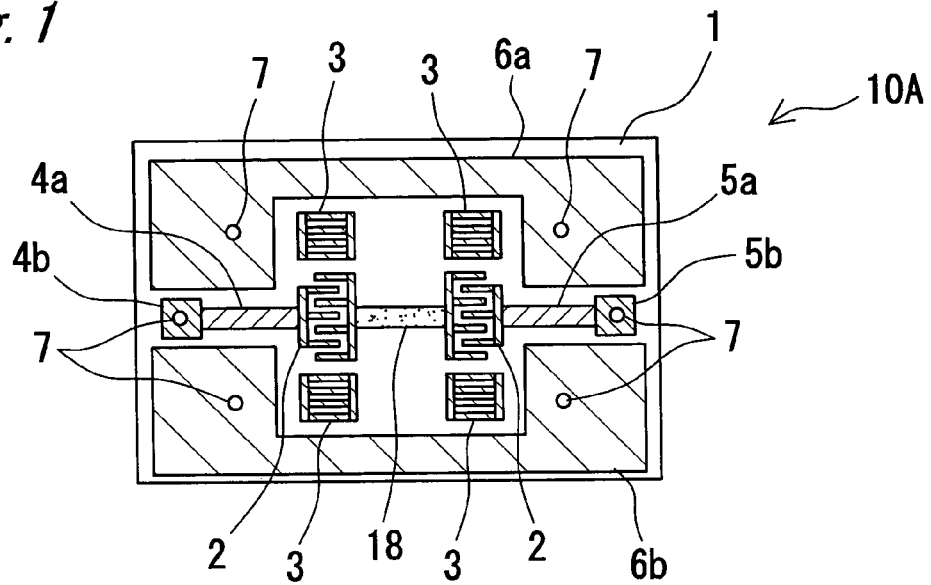
FIG. 1 is a top plan view showing an arrangement of an electrode pattern of a SAW device according to a first embodiment of the present invention.
Figure 2:
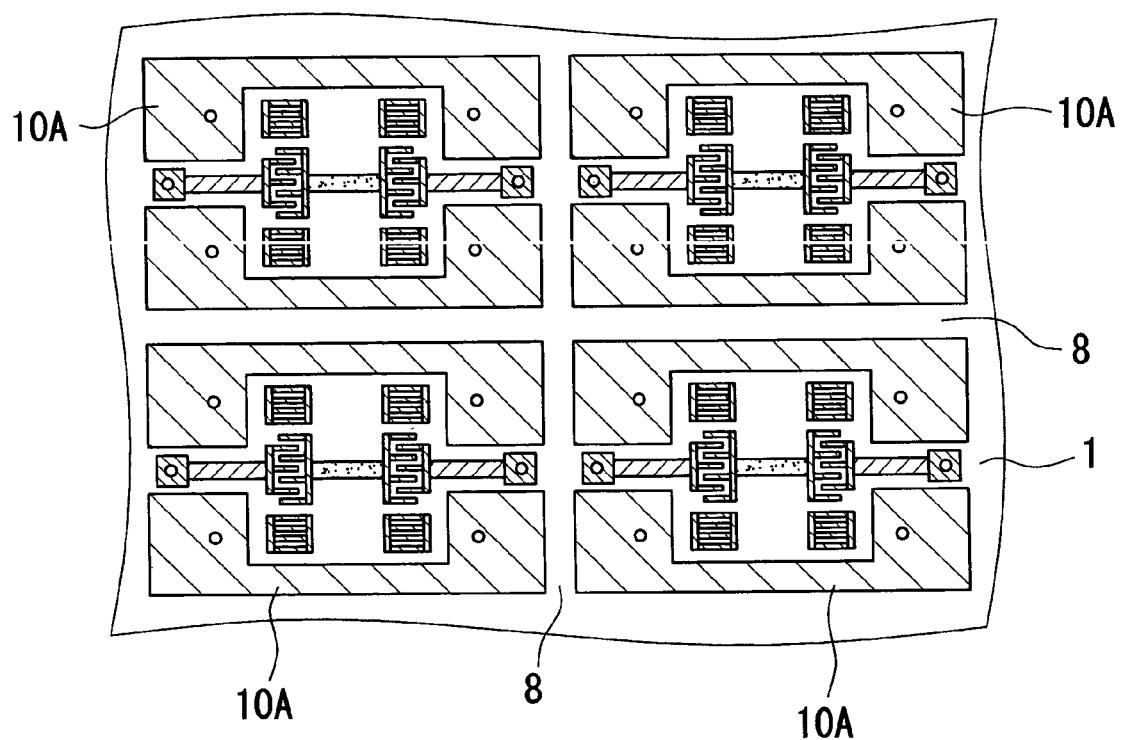
FIG. 2 is a top plan view showing an arrangement of a plurality of the electrode patterns of the SAW device of FIG. 1 formed on a wafer.
Figure 3:
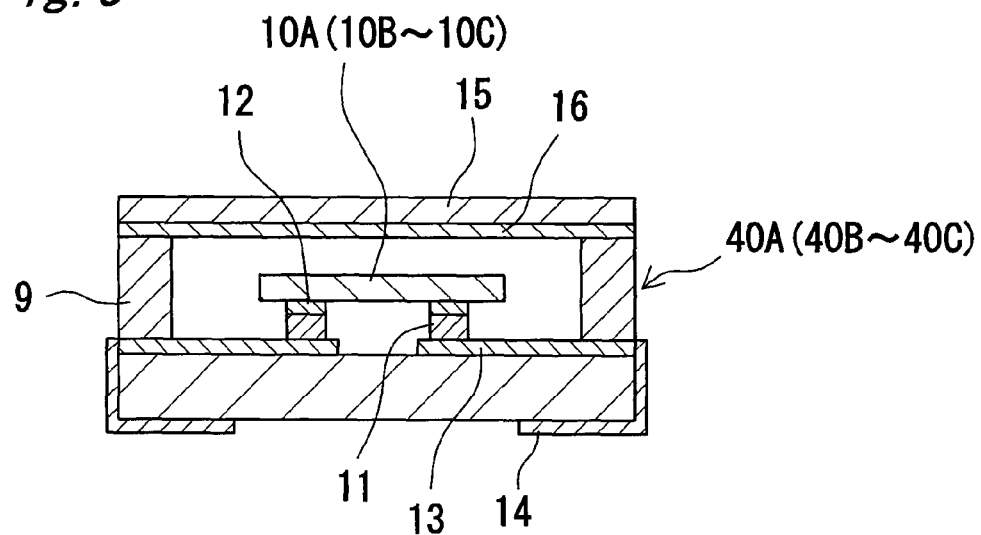
FIG. 3 is a sectional view of an electronic component employing the SAW device of FIG. 1.

Hereinafter, Claims 1 to 5, 8 and 10 to 15 of the present invention are described by utilizing a first embodiment of the present invention. FIG. 1 is a top plan view showing an arrangement of an electrode pattern of a surface acoustic wave (SAW) device 10A according to the first embodiment of the present invention and FIG. 2 is a top plan view showing an arrangement of a plurality of the electrode patterns of FIG. 1 formed on a wafer. Meanwhile, FIG. 3 is a sectional view of an electronic component 40A in which the SAW device 10A is sealed in a package, etc. "1" is a piezoelectric substrate, "2" is a comb-shaped electrode, "3" is a reflector, "4*a*" is an input terminal lead-out electrode, "4*b*" is an input terminal electrode, "5*a*" is an output terminal lead-out electrode, "5*b*" is an output terminal electrode, "6*a*" and "6*b*" are auxiliary electrodes which are electrically independent of each other and have different widths locally, "7" is a bump, "8" is a region disposed between the auxiliary electrodes 6*a* and 6*b* and "18" is a beltlike electrode.

Meanwhile, FIGS. 1 to 3 show an arrangement of the first embodiment schematically and do not illustrate relative ratio of respective dimensions.

A piezoelectric substance generates electric charge by pyroelectric property upon application of heat or strain thereto. In the piezoelectric substance, if electric charge varies locally, potential difference is produced so as to induce electrostatic discharge, thereby resulting in breakdown of a device or deterioration of electrical characteristics. In order to prevent such a phenomenon, it is effective to make the potential identical as rapidly as possible by eliminating the produced potential difference.

In order to make the produced potential identical as much as possible so as to acquire balance of the potential in the SAW device 10A, the present invention has found that it is effective to provide low-impedance portions as widely as possible in a circuit pattern of the SAW device 10A. Namely, in the electrode pattern of the SAW device 10A of the present invention, the comb-shaped electrode 2 and a pair of the reflectors 3 which are disposed at opposite sides of the comb-shaped electrode 2 closely to a propagation direction of a surface wave generated from the comb-shaped electrode 2 are provided on the piezoelectric substrate 1, while the comb-shaped electrode 2 and the reflectors 3 are surrounded by a plurality of the auxiliary electrodes 6*a* and 6*b* which are electrically independent of each other and have different widths locally.

A plurality of the auxiliary electrodes 6a and 6b are connected to a ground of an external circuit such as the substrate 1 having the SAW device 10A mounted thereon. In each SAW device 10A, the auxiliary electrodes 6a and 6b are disposed substantially equivalently, for example, substantially symmetrically with respect to a point, substantially symmetrically with respect to a plane and substantially symmetrically with respect to a line so as to least deviate from each other. In addition, the beltlike input terminal lead-out electrode 4a connected to the comb-shaped electrode 2, the input terminal electrode 4b, the beltlike output terminal lead-out electrode 5a and the output terminal electrode 5b are provided. The beltlike input terminal lead-out electrode and output terminal lead-out electrode 4a and 5a confronting each other are made substantially equal in area and the input terminal electrode 4b and the output terminal electrode 5b confronting each other are made substantially equal in area. Furthermore, the reflector 3 and the auxiliary electrodes 6a and 6b are set in an electrically open state so as to have an electrode arrangement in which the comb-shaped electrodes 2 are connected to each other by the beltlike electrode 18.

Meanwhile, the beltlike input terminal lead-out electrode 4a and the beltlike output terminal lead-out electrode 5a are arranged to be connected to input terminal electrode 4b and the output terminal electrode 5b, respectively.

Meanwhile, since the input terminal lead-out electrode 4a and the output terminal lead-out electrode 5a confront each other so as to have a substantially identical area and the input terminal electrode 4b and the output terminal electrode 5b confront each other so as to have a substantially identical area, balance of generated electric charge can be readily acquired and thus, potential can be made uniform effectively. However, for example, if these electrodes cannot be provided so as to confront each other due to layout of the electrode pattern, the same effect as those of the case in which the electrodes confront each other can be gained when the electrodes are disposed as equivalently as possible by making the electrodes substantially symmetrical with respect to a line or substantially symmetrical with respect to a point.

The auxiliary electrodes 6a and 6b are made as wide as circuit design permits for minimizing the impedance and uniformizing potential. The auxiliary electrodes 6a and 6b are apparently different from thin lines in that the auxiliary electrodes 6a and 6b have different widths locally and have an expanse in area.

Thus, since the comb-shaped electrode 2 and the reflector 3 are surrounded by the auxiliary electrodes 6a and 6b, the auxiliary electrodes 6a and 6b can be made wider than the thin lines and made smaller in impedance between lines and in a plane than the thin lines, so that potential produced by storage of electric charge generated by pyroelectric property of the piezoelectric substrate 1 can be made uniform rapidly in a wider region than the thin lines and thus, the SAW device 10A can be made uniform electrically.

Meanwhile, since the auxiliary electrodes 6a and 6b are connected to the ground of the external circuit such as the substrate 1 having the SAW device 10A mounted thereon so as to be used as ground electrodes of the SAW device 10A, the auxiliary electrodes 6a and 6b can act as grounds electrically common with a ground of a larger external circuit, so that change of potential can be made more rapidly and more uniformly and thus, influence of electric charge generated by pyroelectric property of the piezoelectric substrate 1 can be lessened.

Potential difference of the SAW device 10A is produced by electric charge generated by pyroelectric property of the piezoelectric substrate 1 upon application of heat or strain thereto. In an ordinary state of manufacture, electric charge is not generated locally but is generated from the SAW device 10A as a whole. Generally, in SAW devices, input and output electrodes to be connected to bumps, etc. have largest areas and electric charge is generated quite readily from the input and output electrodes.

Meanwhile, FIGS. 1 and 2 show the arrangement of the SAW device 10A schematically and do not illustrate relative ratio of sizes of constituent elements. Therefore, if a common electrode portion having as large an area as possible is provided at a portion which surrounds a functional portion including the comb-shaped electrode 2 and the reflector 3 so as to have the input terminal electrode 4b and the output terminal electrode 5b at its center, potential can be equalized by uniformizing the generated electric charge efficiently and occurrence OT electrostatic discharge, etc. can be restrained.

Meanwhile, in order to prevent damage to a device due to electrostatic discharge, there are, for example, a method in which a narrow interval portion is preliminarily provided between neighboring electrodes and performs, upon storage of electric charge to some extent, electrostatic discharge partially in such a range as to prevent damage to the device and a method in which nonuniformity itself of potential causing static electricity is restrained. In the method in which electrostatic discharge is performed partially, electric discharge is repeated upon storage of electric charge and thus, it is difficult to obtain a stable state. Meanwhile, in the method in which nonuniformity itself of potential is restrained, electric charge generated from the piezoelectric substrate 1 is not made nonuniform locally by providing the common electrode portion having as large the area as possible, so that potential is equalized and thus, the cause of electrostatic discharge can be removed perpetually.

Therefore, in order to restrain electrostatic discharge, it is more effective to prevent electrostatic discharge by providing the common electrode portion having as large the area as possible in order to widen portions of the equal potential by the comb-shaped electrode 2, the reflector 3 and the auxiliary electrodes 6a and 6b than to cause electrostatic discharge on purpose by controlling the interval between the electrodes.

From the above, it is desirable that the number of division of the auxiliary electrodes 6a and 6b is essentially smaller. However, even in case the electrodes should be divided due to layout of external terminals, the generated electric charge can be uniformized efficiently and occurrence of electrostatic discharge, etc. can be restrained in the arrangement of the present invention.

Meanwhile, in the SAW device 10A, if areas of the beltlike input terminal lead-out electrode and output terminal lead-out electrode 4a and 5a are made substantially equal to each other and areas of the input terminal electrode 4b and the output terminal electrode 5b are made equal to each other, while the auxiliary electrodes 6a and 6b which are electrically independent of each other and are short-circuited in plane are disposed equivalently so as to be well balanced as a whole, a location where a large quantity of electric charge is stored locally can be eliminated and thus, potential can be made more uniform.

Since the auxiliary electrodes 6a and 6b are disposed equivalently so as to be well balanced as a whole, electric charge generated in the reflector 3 can be uniformized even when the reflector 3 is in an electrically open state relative to the auxiliary electrodes 6a and 6b, so that local potential difference does not occur and thus, breakdown of the device or deterioration of electrical characteristics can be eliminated.

Meanwhile, the same effects can be achieved even when a plurality of sets of the comb-shaped electrode 2 and/or the reflector 3 are provided.

The SAW device 10A of the present invention is manufactured as follows. By using a sputtering apparatus (not shown), a metallic thin film of Ti is formed on a piezoelectric substrate 1 made of $LiTaO_3$ or the like. Then, a metallic thin film of Al—Sc—Cu or Ti is formed on the metallic thin film of Ti by using a sputtering apparatus (not shown). Furthermore, by using a deposition apparatus (not shown), a metallic thin film of Al is formed on the input terminal lead-out electrode 4a and the output terminal lead-out electrode 5a. In addition to Al—Sc—Cu and Ti, other metals or alloys may also be used, in accordance with purposes, as materials of the metallic thin films formed by sputtering. At least one metallic thin film, namely, a plurality of the metallic thin films may be laminated on one another in accordance with the purposes and order of lamination of the metallic thin films may be changed in accordance with the purposes.

Then, a resist is coated on the metallic thin film and exposure is performed with a stepper (not shown) by setting a desired photomask to the resist. Subsequently, an exposed portion of the resist is developed by using a developing apparatus (not shown) and an unnecessary portion of the resist is removed. Furthermore, a desired electrode pattern is formed on the metallic thin film by using a dry etching apparatus (not shown) or the like.

After the remaining resist has been removed, resist is coated on the electrode pattern again and exposure is performed with a stepper (not shown) by setting a desired photomask to the resist. Subsequently, an exposed portion of the resist is developed by using a developing apparatus (not shown) and an unnecessary portion of the resist is removed. Thereafter, a metallic thin film of Al or the like is formed by using a deposition apparatus (not shown) so as to form a deposited film of Al on the input terminal electrode 4b and the output terminal electrode 5b and the remaining resist is removed.

Meanwhile, in addition to the above described method of forming the desired electrode pattern, another method, for example, may be employed in which after a desired metallic thin film has been formed, the desired electrode pattern is formed on the metallic thin film at a time by using a dry etching apparatus (not shown).

Then, by using a dicing apparatus (not shown) or the like, the thus obtained article is cut along dicing lines into a plurality of the SAW devices 10A.

Meanwhile, supposing that "$\lambda$" denotes a wavelength of an operating frequency of the SAW device 10A, a width of the auxiliary electrodes 6a and 6b in the electrode pattern employed in the first embodiment is in the range of $\lambda/4$ to $100\lambda$ but may be in other ranges than the above range.

Subsequently, the electronic component 40A is assembled by using the thus obtained SAW device 10A. FIG. 3 is a sectional view of the electronic component 40A employing the SAW device 10A. "9" is a base member, "10A" is the SAW device, "11" is a bump, "12" is a pad, "13" is a lead-out electrode, "14" is a terminal electrode, "15" is a cover and "16" is a bonding member.

The bump 11 made of gold or the like is formed on the pad 12 of the SAW device 10A. Then, the SAW device 10A formed with the bump 11 is provided on the base member 9 having the lead-out electrode 13 and the terminal electrode 14 preliminarily such that the bump 11 comes into contact with the lead-out electrode 13, so that the bump 11 is bonded to the lead-out electrode 13 by ultrasonic wave or the like so as to be mounted thereon.

Thereafter, by using a sealing apparatus (not shown), the base member 9 having the SAW device 10A and the cover 15 bearing preliminarily the bonding member 16 such as solder are provided so as to cause the bonding member 16 to confront the base member 9 and are heated and sealed, so that the electronic component 40A is obtained.

In addition to the above described method of manufacturing the electronic component 40A, another method, for example, wire bonding may be used as necessary for mounting and gold or brazing filler metal containing gold, for example, may be used as the bonding member 16.

Meanwhile, in comparison with wire bonding, bump bonding can increase area of its contact with the electrode to be bonded thereto and therefore, can raise bonding reliability. On the other hand, in case strain produced at the time of bump bonding remains at the electrode held in contact with the bump, the electrodes may be separated from each other, thus resulting in drop of bonding reliability contrarily.

The present invention has found that when the metallic thin film is formed by deposition, strain at the time of bump bonding, electrical corrosion and corrosion at the time of cutting are less likely to be produced than sputtering. This reason is considered that sputtering merely piles metallic particles on one another physically, while in deposition, formation of a thin film having orientation identical with crystalline orientation strengthens coupling between metallic particles. Therefore, if at least an uppermost layer of the electrode brought into contact with the bump is formed by deposition at the time of bump bonding, reliability of bonding is raised by restraining occurrence of strain due to bonding and electrical corrosion due to bonding between different metals can be restrained. The metallic thin film formed by deposition has better bonding property relative to the bump when made of softer metal and therefore, is desirably made of, for example, aluminum or aluminum-copper alloy.

Meanwhile, the same effects can be obtained when an additional layer is formed on the uppermost layer of the electrode brought into contact with the bump. Meanwhile, if the electrode is formed by piling pieces made of not less than one metal, for example, Al, Ti, Cu, Cr and Ni or alloy of these metals, respectively, withstand power is raised. Thus, if the uppermost layer of the electrode is formed on a pile of pieces made of a plurality of the metals, respectively, it is possible to obtain an electrode in which occurrence of bonding strain is restrained and withstand power is raised.

Meanwhile, in the first embodiment, the auxiliary electrodes 6a and 6b are split into two portions but may be split into any plural portions. The bump may be formed at other locations than that indicated in the first embodiment. Width of the beltlike input terminal lead-out electrode and output terminal lead-out electrode 4a and 5a may be fixed or variable.

Since the comb-shaped electrode 2 of the thus obtained SAW device 10A is connected to only the input terminal lead-out electrode 4a, the input terminal electrode 4b, the output terminal lead-out electrode 5a, the output terminal electrode 5b and the beltlike electrode 18 connecting the comb-shaped electrodes 2, electrical characteristics of the SAW device 10A can be measured in advance by electrically connecting a proper terminal to the SAW device 10A. Namely, since electrical characteristics of the SAW device 10A can be measured in a wafer state preliminarily, only conforming articles can be used at a subsequent process by selecting characteristics prior to dicing of the wafer into a plurality of the SAW devices 10A.

In accordance with the present invention as is clear from the foregoing, since the comb-shaped electrode 2 and the reflector 3 are surrounded by the auxiliary electrodes 6a and 6b which are electrically independent of each other and have different widths locally and the uppermost layer of the electrode brought into contact with the bump at least is formed by deposition, such effects that the excellent SAW device 10D can be simply manufactured are gained in which potential produced by pyroelectric property of the piezoelectric substrate 1 can be uniformized more rapidly and more simply, bonding property of the electrodes is upgraded, corrosion due to bonding of different metals is restrained, withstand power is raised, while breakdown of the device and deterioration of characteristics due to electrostatic discharge or the like are eliminated.

(Second Embodiment)

Figure 4:
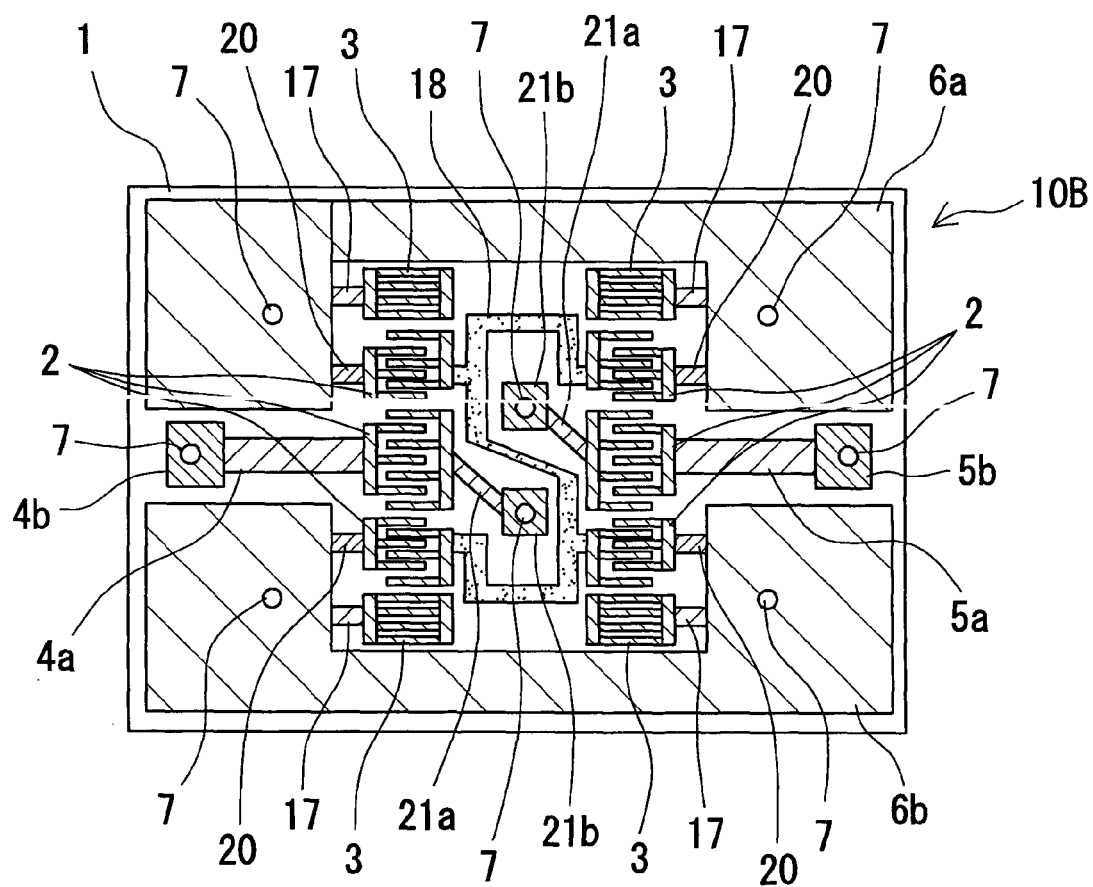
FIG. 4 is a top plan view showing an arrangement of an electrode pattern of a SAW device according to a second embodiment of the present invention.

Hereinafter, Claims 1 to 7 and 10 to 15 are described by utilizing a second embodiment of the present invention. FIG. 4 is a top plan view showing an arrangement of an electrode pattern of a SAW device 10B according to the second embodiment of the present invention. In FIG. 4, parts identical with those of FIG. 1 in the first embodiment are designated by identical reference numerals and the detailed description is abbreviated for the sake of brevity. Meanwhile, FIG. 4 shows an arrangement of the second embodiment schematically and does not illustrate relative ratio of respective dimensions.

FIG. 4 of the second embodiment is different from FIG. 1 of the first embodiment in that in FIG. 4, the reflector 3 is electrically connected to the auxiliary electrodes 6a and 6b by a plurality of beltlike electrodes 17 and the three comb-shaped electrodes 2 are provided for each of input and output terminals such that the two comb-shaped electrodes 2 disposed at opposite ends of the three comb-shaped electrodes 2 not only are connected to each other by the beltlike electrode 18 but are each connected to each of the auxiliary electrodes 6a and 6b by a beltlike electrode 20.

Namely, in the first embodiment, the reflector 3 is in an electrically open state relative to the auxiliary electrodes 6a and 6b. On the other hand, in the second embodiment, the comb-shaped electrode 2, the reflector 3 and the auxiliary electrodes 6a and 6b are electrically connected to one another by a plurality of the beltlike electrodes 17, 18 and 20. In other respects, the SAW device 10B and an electronic component 40B (FIG. 3) are manufactured in the same manner as the first embodiment.

In FIG. 4, since the comb-shaped electrode 2 and the reflector 3 are electrically connected to the auxiliary electrodes 6a and 6b by a plurality of the beltlike electrodes 17 and 20 and a plurality of sets of the comb-shaped electrodes 2 are electrically connected to each other by the beltlike electrode 18, electric charge generated in the comb-shaped electrode 2, the reflector 3, etc. is delivered to the auxiliary electrodes 6a and 6b via a plurality of the beltlike electrodes 17, 18 and 20, so that potential can be uniformized, as a whole, over the wide electrodes including the auxiliary electrodes 6a and 6b.

Namely, since the comb-shaped electrode 2 and the reflector 3 are connected to the auxiliary electrodes 6a and 6b by a plurality of the beltlike electrodes 17 and 20, the wider electrodes including the comb-shaped electrode 2 and the reflector 3 can act as a common electrode, so that the generated electric charge can be uniformized over a wider area so as to equalize potential. In addition, by connecting the comb-shaped electrode 2 and the reflector 3 to the wide electrodes, impedance can be reduced in comparison with an electrically open state.

Meanwhile, effects gained by electrically connecting the reflector 3 to the auxiliary electrodes 6a and 6b vary according to design of the electrode pattern. If the electrodes capable of uniformizing potential can be connected at low impedance, the electrodes may be linear or planar and the number of the electrodes may be arbitrary. However, it is more effective that the electrodes are desirably planar and the number of the electrodes is large.

Meanwhile, in case the reflectors 3 are electrically connected to the auxiliary electrodes 6a and 6b by lines, it is not preferable that a high-impedance portion is present in the course of connection paths. Hence, it is desirable that the line width is constant or becomes smaller towards an outer peripheral portion.

Therefore, in comparison with the first embodiment, since the comb-shaped electrode 2, the reflector 3 and the auxiliary electrodes 6a and 6b are connected to one another by a plurality of the beltlike electrodes 17, 18 and 20, the wider electrodes including the comb-shaped electrode 2 and the reflector 3 can act as the common electrode, so that the generated electric charge can be uniformized over a wider area so as to equalize potential. Hence, since influence of potential due to the generated electric charge can be lessened further, such effects that the excellent SAW device 10B can be simply manufactured are achieved in which breakdown of the device and deterioration of characteristics due to electrostatic discharge or the like are eliminated.

Meanwhile, in FIG. 4, "21a" denotes a ground terminal lead-out electrode and "21b" denotes a ground terminal electrode.

(Third Embodiment)

Figure 5:
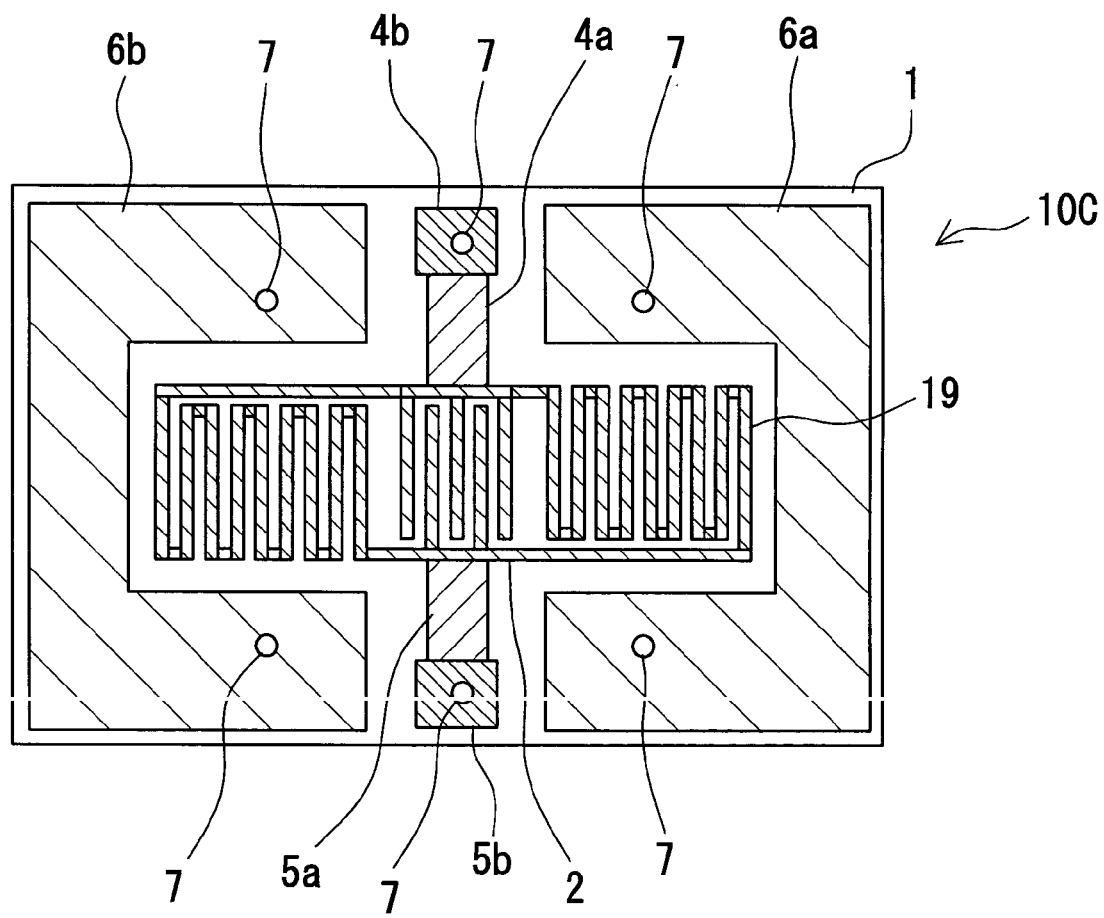
FIG. 5 is a top plan view showing an arrangement of an electrode pattern of a SAW device according to a third embodiment of the present invention.

Hereinafter, Claims 1 to 5 and 9 to 15 of the present invention are described by utilizing a third embodiment of the present invention. FIG. 5 is a top plan view showing an arrangement of an electrode pattern of a SAW device 10C according to the third embodiment of the present invention. In FIG. 5, parts identical with those of FIG. 1 in the first embodiment are designated by identical reference numerals and the detailed description is abbreviated for the sake of brevity. FIG. 5 of the third embodiment is different from FIG. 1 of the first embodiment in that in FIG. 5, the reflector 3 is formed by a meander line and is electrically connected to the comb-shaped electrode 2. Meanwhile, FIG. 5 shows an arrangement of the third embodiment schematically and does not illustrate relative ratio of respective dimensions.

Namely, the comb-shaped electrode 2 and the reflector 3 are set in an electrically open state in the first embodiment, while the comb-shaped electrode 2 and the reflector 3 are electrically connected to each other. In other respects, the SAW device 10C and an electronic component 40C (FIG. 3) are manufactured in the same manner as the first embodiment.

In FIG. 5, a reflector 19 formed by the meander line is electrically connected to the comb-shaped electrode 2 and signals in use are transmitted therebetween in DC or at low frequencies. However, in a high-frequency band for operating the SAW device 10C, impedance of the meander line rises and thus, the meander line is substantially set in an open state relative to the comb-shaped electrode 2.

Meanwhile, since a common electrode portion can be enlarged by electrically connecting the comb-shaped electrode 2 and the reflector 19 formed by the meander line, electric charge generated by pyroelectric property of the piezoelectric substrate 1 can be uniformized over a wider electrode or a longer electrode as a whole, so that potential difference produced at respective portions can be lessened.

Namely, since the reflector 19 formed by the meander line is electrically connected to the comb-shaped electrode 2, the comb-shaped electrode 2 and the reflector 3 are set in a substantially open state in the high-frequency band so as to not only eliminate malfunctions but enlarge an electrically connected common base, so that potential difference produced at respective portions is lessened and thus, occurrence of electrostatic discharge, etc. can be restrained.

Therefore, in comparison with the first embodiment, such effects that the excellent SAW device 10C can be simply manufactured are obtained in which potential difference produced at respective portions including the comb-shaped electrode 2 and the reflector 19 can be lessened further and breakdown of the device and deterioration of characteristics due to electrostatic discharge or the like are eliminated.

(Fourth Embodiment)

Figure 6:
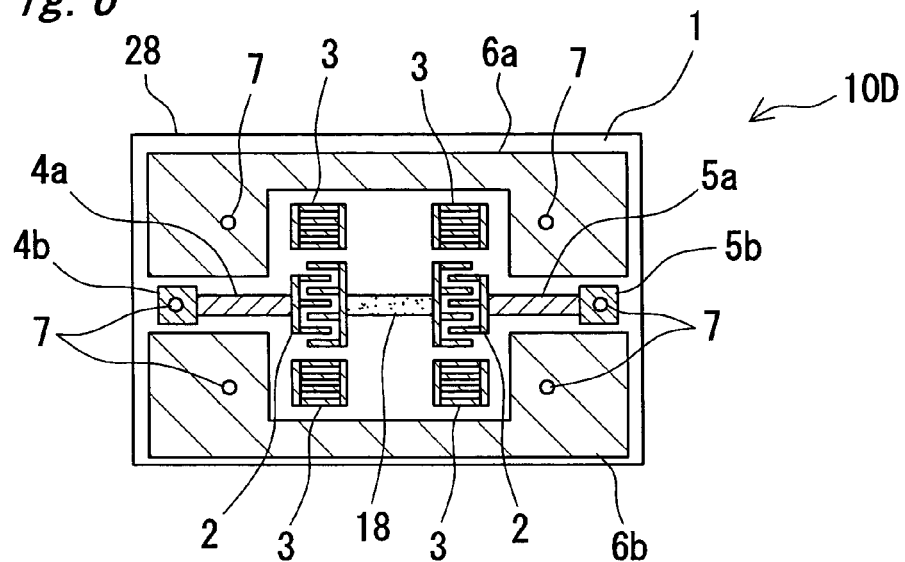
FIG. 6 is a top plan view showing an arrangement of an electrode pattern of a SAW device according to a fourth embodiment of the present invention.
Figure 7:
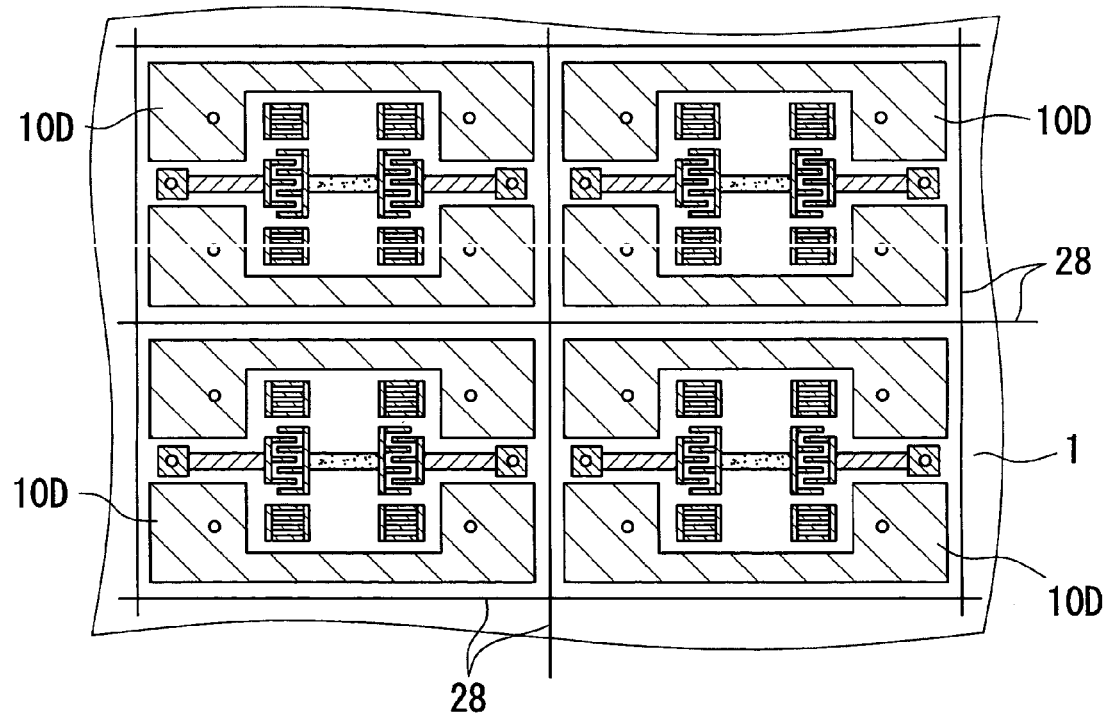
FIG. 7 is a top plan view showing an arrangement of a plurality of the electrode patterns of the SAW device of FIG. 6 formed on a wafer.
Figure 8:
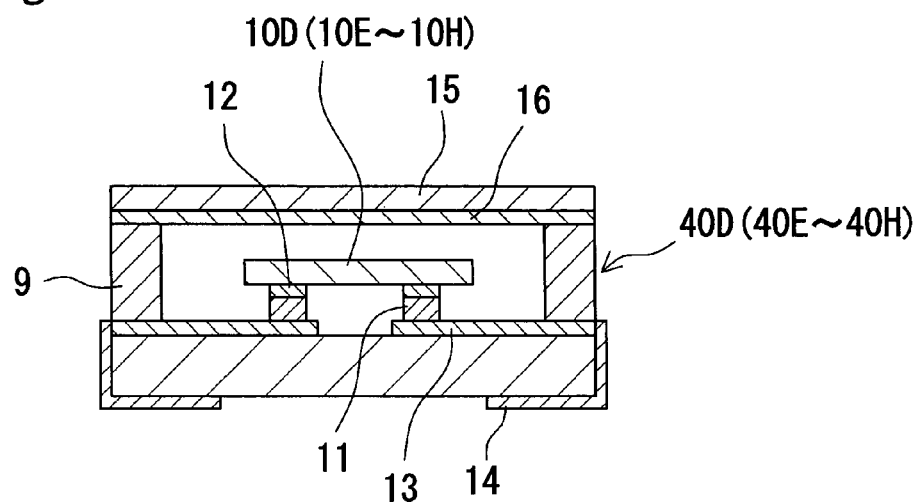
FIG. 8 is a sectional view of an electronic component employing the SAW device of FIG. 6.

Hereinafter, Claims 16 to 20 of the present invention are described by utilizing a fourth embodiment of the present invention. FIG. 6 is a top plan view showing an arrangement of an electrode pattern of a SAW device 10D according to the fourth embodiment of the present invention and FIG. 7 is a top plan view showing an arrangement of a plurality of the electrode patterns of FIG. 6 formed on a wafer. Meanwhile, FIG. 8 is a sectional view showing an electronic component 40D in which the SAW device 10D is sealed in a package, etc.

FIG. 6 of the fourth embodiment is different from FIG. 1 of the first embodiment in that in FIG. 6, dicing lines 28 are provided on the piezoelectric substrate 1 of the SAW device 10D. Meanwhile, FIGS. 6 to 8 show an arrangement of the fourth embodiment schematically and does not illustrate relative ratio of respective dimensions.

A piezoelectric substance generates electric charge by pyroelectric property upon application of heat or strain thereto. In the piezoelectric substance, if electric charge varies locally, potential difference is produced so as to induce electrostatic discharge, thereby resulting in breakdown of a device or deterioration of electrical characteristics. In order to prevent such a phenomenon, it is effective to make the potential identical as rapidly as possible by eliminating the produced potential difference.

In order to make the produced potential identical as much as possible so as to acquire balance of the potential in the SAW device 10D, the present invention has found that it is effective to provide low-impedance portions as widely as possible in a circuit pattern of the SAW device 10D. Namely, in the electrode pattern of the SAW device 10D of the present invention, the dicing lines 28 are provided on the piezoelectric substrate 1 and inside the dicing lines 28, the comb-shaped electrode 2 and a pair of the reflectors 3 are disposed at opposite sides of the comb-shaped electrode 2 closely to a propagation direction of a surface wave generated from the comb-shaped electrode 2 such that the comb-shaped electrode 2 and the reflectors 3 are surrounded by the auxiliary electrodes 6a and 6b.

The auxiliary electrodes 6a and 6b are used as ground electrodes. In each SAW device 10D, the auxiliary electrodes 6a and 6b are disposed substantially equivalently, for example, substantially symmetrically with respect to a point and substantially symmetrically with respect to a plane so as not to deviate from each other. In addition, the beltlike input terminal lead-out electrode 4a and the beltlike output terminal lead-out electrode 5a, which are connected to the comb-shaped electrode 2 are made substantially equal in area, while the input terminal electrode 4b and the output terminal electrode 5b, which are connected to the input terminal lead-out electrode 4a and the output terminal lead-out electrode 5a, respectively are provided so as to confront each other and are made substantially equal in area. Furthermore, the reflector 3 and the auxiliary electrodes 6a and 6b are set in an electrically open state so as to have an electrode arrangement in which the comb-shaped electrodes 2 are connected to each other by the beltlike electrode 18.

Meanwhile, since the input terminal lead-out electrode 4a and the output terminal lead-out electrode 5a confront each other so as to have a substantially identical area and the input terminal electrode 4b and the output terminal electrode 5b confront each other so as to have a substantially identical area, balance of generated electric charge can be readily acquired and thus, potential can be made uniform effectively. However, for example, if these electrodes cannot be provided so as to confront each other due to layout of the electrode pattern, the same effect as those of the case in which the electrodes confront each other can be gained when the electrodes are disposed as equivalently as possible by making the electrodes substantially symmetrical with respect to a line or substantially symmetrical with respect to a point.

The auxiliary electrodes 6a and 6b are made as wide as circuit design permits for minimizing the impedance and uniformizing potential. The auxiliary electrodes 6a and 6b are apparently different from thin lines in that the auxiliary electrodes 6a and 6b have different widths locally and have an expanse in area.

Thus, since the comb-shaped electrode 2 and the reflector 3 are surrounded by the auxiliary electrodes 6a and 6b, the auxiliary electrodes 6a and 6b can be made wider than the thin lines and made smaller in impedance between lines and in a plane than the thin lines, so that potential produced by storage of electric charge generated by pyroelectric property of the piezoelectric substrate 1 can be made uniform rapidly in a wider region than the thin lines.

Meanwhile, since the auxiliary electrodes 6a and 6b are connected to the ground of the external circuit such as the substrate 1 having the SAW device 10D mounted thereon so as to be used as ground electrodes of the SAW device 10D, the auxiliary electrodes 6a and 6b can act as grounds electrically common with a ground of a larger external circuit, so that change of potential can be made more rapidly and more uniformly and thus, influence of electric charge generated by pyroelectric property of the piezoelectric substrate 1 can be lessened.

Potential difference of the SAW device 10D is produced by electric charge generated by pyroelectric property of the piezoelectric substrate 1 upon application of heat or strain thereto. In an ordinary state of manufacture, electric charge is not generated locally but is generated from the SAW device 10D as a whole. Generally, in SAW devices, input and output electrodes to be connected to bumps, etc. have largest areas and a largest electric charge is generated from the input and output electrodes.

Meanwhile, FIGS. 6 and 7 show the arrangement of the SAW device 10D schematically and do not illustrate relative ratio of sizes of constituent elements.

Therefore, if a common electrode portion having as large an area as possible is provided at a portion which surrounds a functional portion including the comb-shaped electrode 2 and the reflector 3 so as to have the input terminal electrode 4b and the output terminal electrode 5b at its center, potential can be equalized by uniformizing the generated electric charge efficiently and occurrence of electrostatic discharge, etc. can be restrained.

Meanwhile, in order to prevent damage to a device due to electrostatic discharge, there are, for example, a method in which a narrow interval portion is preliminarily provided between neighboring electrodes and performs, upon storage of electric charge to some extent, electrostatic discharge partially in such a range as to prevent damage to the device and a method in which nonuniformity itself of potential causing static electricity is restrained. In the method in which electrostatic discharge is performed partially, electric discharge is repeated upon storage of electric charge and thus, it is difficult to obtain a stable state. Meanwhile, in the method in which nonuniformity itself of potential is restrained, electric charge generated from the piezoelectric substrate 1 is not made nonuniform locally by providing the common electrode portion having as large the area as possible, so that potential is equalized and thus, the cause of electrostatic discharge can be removed perpetually.

Therefore, in order to restrain electrostatic discharge, it is more effective to prevent electrostatic discharge by providing the common electrode portion having as large the area as possible in order to widen portions of the equal potential by the comb-shaped electrode 2, the reflector 3 and the auxiliary electrodes 6a and 6b than to cause electrostatic discharge on purpose by controlling the interval between the electrodes.

From the above, it is desirable that the number of division of the auxiliary electrodes 6a and 6b is essentially smaller. However, even in case the electrodes should be divided due to layout of external terminals, the generated electric charge can be uniformized efficiently and occurrence of electrostatic discharge, etc. can be restrained in the arrangement of the present invention.

Meanwhile, in the SAW device 10D, if areas of the beltlike input terminal lead-out electrode and output terminal lead-out electrode 4a and 5a are made substantially equal to each other and areas of the input terminal electrode 4b and the output terminal electrode 5b are made equal to each other, while the auxiliary electrodes 6a and 6b which are electrically independent of each other and are short-circuited in plane are disposed equivalently so as to be well balanced as a whole, a location where a large quantity of electric charge is stored locally can be eliminated and thus, potential can be made more uniform.

Since the auxiliary electrodes 6a and 6b are disposed equivalently so as to be well balanced as a whole, electric charge generated in the SAW device 10D can be uniformized even when the reflector 3 is in an electrically open state relative to the auxiliary electrodes 6a and 6b or the dicing lines 28 and the reflector 3 are in an electrically open state, so that local potential difference does not occur and thus, breakdown of the device or deterioration of electrical characteristics can be eliminated.

Meanwhile, by cutting the substrate 1 along the dicing lines 28, positioning for cutting can be performed easily. By providing the electrically short-circuited dicing lines 28 at an outer peripheral portion of the SAW device 10D, generated electric charge can be uniformized effectively meanwhile, the same effects can be achieved even when a plurality of sets of the comb-shaped electrode 2 and/or the reflector 3 are provided.

The SAW device 10D of the present invention is manufactured as follows. By using a sputtering apparatus (not shown), a metallic thin film of Ti is formed on a piezoelectric substrate 1 made of $LiTaO_3$ or the like. Then, a metallic thin film of Al—Sc—Cu or Ti is formed on the metallic thin film of Ti by using a sputtering apparatus (not shown). In addition to Al—Sc—Cu and Ti, other metals or alloys may also be used, in accordance with purposes, as materials for the metallic thin films formed by sputtering. At least one metallic thin film, namely, a plurality of the metallic thin films may be laminated on one another in accordance with the purposes and order of lamination of the metallic thin films may be changed in accordance with the purposes.

Then, a resist is coated on the metallic thin film and exposure is performed with a stepper (not shown) by setting a desired photomask to the resist. Subsequently, an exposed portion of the resist is developed by using a developing apparatus (not shown) and an unnecessary portion of the resist is removed. Furthermore, a desired electrode pattern is formed on the metallic thin film by using a dry etching apparatus (not shown) or the like.

After the remaining resist has been removed, resist is coated on the electrode pattern again and exposure is performed with a stepper (not shown) by setting a desired photomask to the resist. Subsequently, an exposed portion of the resist is developed by using a developing apparatus (not shown) and an unnecessary portion of the resist is removed. Thereafter, a metallic thin film of Al or the like is formed by using a deposition apparatus (not shown) so as to form a deposited film of Al on the input terminal electrode 4b and the output terminal electrode 5b and the remaining resist is removed.

In addition to the input terminal electrode 4b and the output terminal electrode 5b, the deposited film of Al may also be formed as necessary on other portions, for example, the input terminal lead-out electrode 4a, the output terminal lead-out electrode 5a and the auxiliary electrode 6 short-circuited in a shape of a frame.

Meanwhile, in addition to the above described method of forming the desired electrode pattern, another method, for example, may be employed in which after a desired metallic thin film has been formed, the desired electrode pattern is formed on the metallic thin film at a time by using a dry etching apparatus (not shown).

Then, by using a dicing apparatus (not shown) or the like, the thus obtained article is cut along the dicing lines 28 into a plurality of the SAW devices 10D.

Meanwhile, supposing that "$\lambda$" denotes a wavelength of an operating frequency of the SAW device 10D, a width of the auxiliary electrodes 6a and 6b in the electrode pattern employed in the first embodiment is in the range of $\lambda/4$ to $100\lambda$ but may be in other ranges than the above range.

Subsequently, the electronic component 40D is assembled by using the thus obtained SAW device 10D as shown in FIG. 8. In the same manner as FIG. 3, the electronic component 40D of FIG. 8 includes a base member 9, the SAW device 10D, the bump 11, the pad 12, the lead-out electrode 13, the terminal electrode 14, the cover 15 and the bonding member 16.

The bump 11 made of gold or the like is formed on the pad 12 of the SAW device 10D. Then, the SAW device 10D formed with the bump 11 is provided on the base member 9 having the lead-out electrode 13 and the terminal electrode 14 preliminarily such that the bump 11 comes into contact with the lead-out electrode 13, so that the bump 11 is bonded to the lead-out electrode 13 by ultrasonic wave or the like so as to be mounted thereon.

Thereafter, by using a sealing apparatus (not shown), the base member 9 having the SAW device 10D and the cover 15 bearing preliminarily the bonding member 16 such as solder are provided so as to cause the bonding member 16 to confront the base member 9 and are heated and sealed, so that the electronic component 40D is obtained.

In addition to the above described method of manufacturing the electronic component 40D, another method, for example, wire bonding may be used as necessary for connection to an external terminal and gold or brazing filler metal containing gold, for example, may be used as the bonding member 16.

Meanwhile, in comparison with wire bonding, bump bonding can increase area of its contact with the electrode to be bonded thereto and therefore, can raise bonding reliability. On the other hand, in case strain produced at the time of bump bonding remains at the electrode held in contact with the bump, the electrodes may be separated from each other, thus resulting in drop of bonding reliability contrarily.

The present invention has found that when the metallic thin film is formed by deposition, strain at the time of bump bonding, electrical corrosion and corrosion at the time of cutting are less likely to be produced than sputtering. This reason is considered that sputtering merely piles metallic particles on one another physically, while in deposition, formation of a thin film having orientation identical with crystalline orientation strengthens coupling between metallic particles. Therefore, if at least an uppermost layer of the electrode brought into contact with the bump is formed by deposition at the time of bump bonding, reliability of bonding is raised by restraining occurrence of strain due to bonding and electrical corrosion due to bonding between different metals can be restrained. The metallic thin film formed by deposition has better bonding property relative to the bump when made of softer metal and therefore, is desirably made of, for example, aluminum or aluminum-copper alloy.

Meanwhile, the same effects can be obtained when an additional layer is formed on the uppermost layer of the electrode brought into contact with the bump. Meanwhile, if the electrode is formed by piling pieces made of not less than one metal, for example, Al, Ti, Cu, Cr and Ni or alloy of these metals, respectively, withstand power is raised. Thus, if the uppermost layer of the electrode is formed on a pile of pieces made of a plurality of the metals, respectively, it is possible to obtain an electrode in which occurrence of bonding strain is restrained and withstand power is raised.

Meanwhile, in the fourth embodiment, the auxiliary electrodes 6a and 6b are split into two portions but may be split into any plural portions. The bump may be formed at other locations than that indicated in the fourth embodiment. Width of the beltlike input terminal lead-out electrode and output terminal lead-out electrode 4a and 5a may be fixed or variable.

Since hot terminals of the thus obtained SAW device 10D, for example, the input terminal lead-out electrode 4a, the output terminal lead-out electrode 5a, the input terminal electrode 4b, the output terminal electrode 5b and the beltlike electrode 18 are not connected to the dicing lines 28, the hot terminals are electrically dependent of the dicing lines 28, so that electrical characteristics of the SAW device 10D can be beforehand measured by electrically connecting the terminals to a necessary electrode. Namely, since electrical characteristics of the SAW device 10D can be measured in a wafer state preliminarily, the electronic component 40D can be assembled by using only conforming articles at a subsequent process by selecting characteristics prior to dicing of the wafer into a plurality of the SAW devices 10D.

In accordance with the present invention as is clear from the foregoing, since inside the dicing lines 28, the comb-shaped electrode 2 and the reflector 3 are surrounded by the auxiliary electrodes 6a and 6b which are electrically independent of each other and have different widths locally and the uppermost layer of the electrode brought into contact with the bump at least is formed by deposition, such effects that the excellent SAW device 10D can be simply manufactured are gained in which potential produced by pyroelectric property of the piezoelectric substrate 1 can be uniformized more rapidly and more simply, bonding property of the electrodes is upgraded, corrosion due to bonding of different metals is restrained, withstand power is raised and breakdown of the device and deterioration of characteristics due to electrostatic discharge or the like are eliminated.

(Fifth Embodiment)

Figure 9:
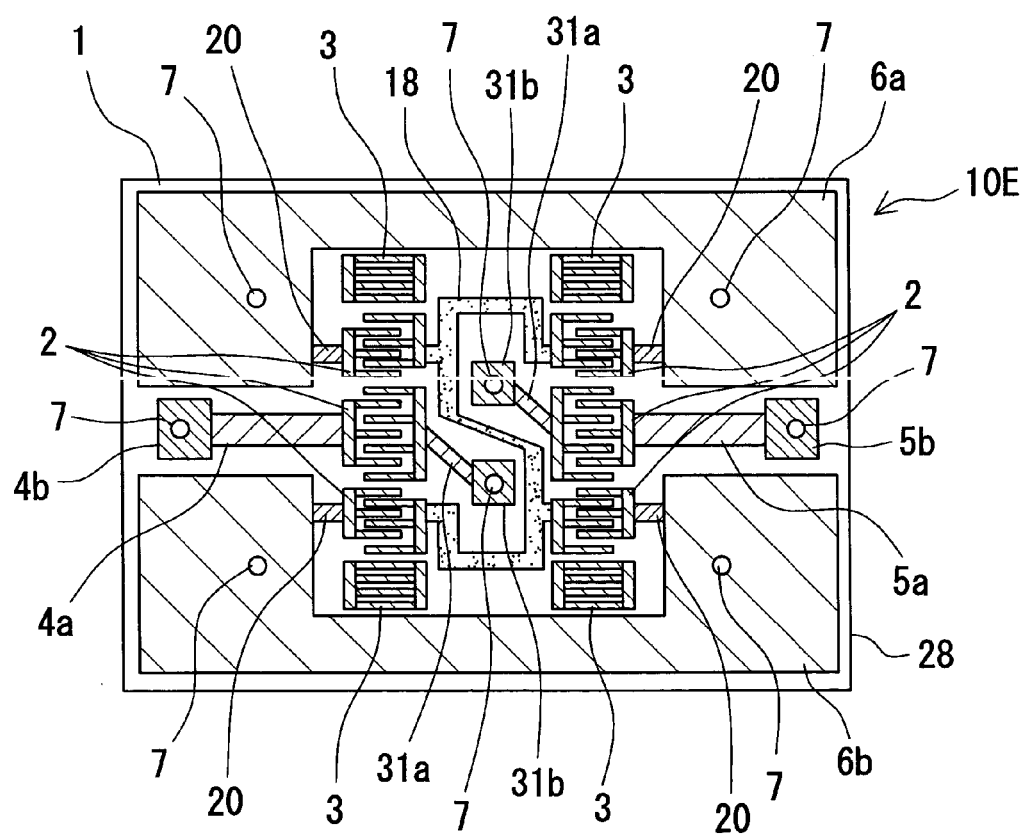
FIG. 9 is a top plan view showing an arrangement of an electrode pattern of a SAW device according to a fifth embodiment of the present invention.

FIG. 9 is a top plan view showing an arrangement of an electrode pattern of a SAW device 10E according to a fifth embodiment of the present invention. In FIG. 9, parts identical with those of FIG. 6 in the fourth embodiment are designated by identical reference numerals and the detailed description is abbreviated for the sake of brevity. Meanwhile, FIG. 9 shows an arrangement of the fifth embodiment schematically and does not illustrate relative ratio of respective dimensions.

FIG. 9 of the fifth embodiment is different from FIG. 6 of the fourth embodiment in that in FIG. 9, the reflector 3 is in an electrically open state relative to the auxiliary electrodes 6a and 6b and the three comb-shaped electrodes 2 are provided for each of input and output terminals such that the two comb-shaped electrodes 2 disposed at opposite ends of the three comb-shaped electrodes 2 not only are connected to each other by the beltlike electrode 18 but are each connected to each of the auxiliary electrodes 6a and 6b electrically by the beltlike electrode 20.

Namely, in the fourth embodiment, the comb-shaped electrode 2 is in an electrically open state relative to the auxiliary electrodes 6a and 6b, while in the fifth embodiment, the three comb-shaped electrodes 2 are provided for each of input and output terminals such that the two comb-shaped electrodes 2 disposed at opposite ends of the three comb-shaped electrodes 2 not only are each connected to each of the auxiliary electrodes 6a and 6b electrically by the beltlike electrode 20 but are connected to each other by the beltlike electrode 18. The SAW device 10E and an electronic component 40E (FIG. 8) are manufactured in the same manner as the fourth embodiment except for the above points.

In FIG. 9, since a corresponding one of the comb-shaped electrodes 2 is electrically connected to each of the auxiliary electrodes 6a and 6b by the beltlike electrode 20 and a plurality of sets of the comb-shaped electrodes 2 are electrically connected to each other by the beltlike electrode 18, electric charge generated in the comb-shaped electrodes 2, etc. is delivered to the auxiliary electrodes 6a and 6b through the beltlike electrodes 20, so that potential can be uniformized, as a whole, over the wider electrodes including the auxiliary electrodes 6a and 6b.

Namely, since the two comb-shaped electrodes 2 disposed at the opposite ends of the three comb-shaped electrodes 2 are connected to the auxiliary electrodes 6a and 6b by the beltlike electrodes 20, the wider electrodes can be used as a common electrode, so that the generated electric charge can be uniformized over a wider area including the comb-shaped electrodes 2 so as to equalize potential. In addition, by connecting the comb-shaped electrodes 2 to the auxiliary electrodes 6a and 6b by the wide electrodes, impedance can be lessened in comparison with an electrically open state, so that electrostatic discharge is least likely to happen.

Meanwhile, effects gained by electrically connecting the comb-shaped electrodes 2 to the auxiliary electrodes 6a and 6b vary according to design of the electrode pattern. If the electrodes capable of uniformizing potential can be connected at low impedance, the electrodes may be linear or planar and the number of the electrodes may be arbitrary. However, it is more effective that the electrodes are desirably planar and the number of the electrodes is large.

Meanwhile, in case the comb-shaped electrodes 2 are electrically connected to the auxiliary electrodes 6a and 6b by lines, it is not preferable that a high-impedance portion is present in the course of connection paths. Hence, it is desirable that the line width is constant or becomes smaller towards an outer peripheral portion. Generally, in design of the electrode pattern, since the dicing lines are made thinnest, it is desirable that the lines for connecting the comb-shaped electrodes 2 to the auxiliary electrodes 6a and 6b are at least as thin as or thicker than the dicing lines 28.

Therefore, in comparison with the fourth embodiment, since the wider electrodes including the comb-shaped electrodes 2 can be used as a common electrode, the generated electric charge can be uniformized over a wider area so as to equalize potential, so that the excellent SAW device 10E can be simply manufactured in which breakdown of the device and deterioration of characteristics due to electrostatic discharge or the like are eliminated.

In FIG. 9, "31a" denotes a ground lead-out electrode and "31b" denotes a ground electrode.

(Sixth Embodiment)

Figure 10:
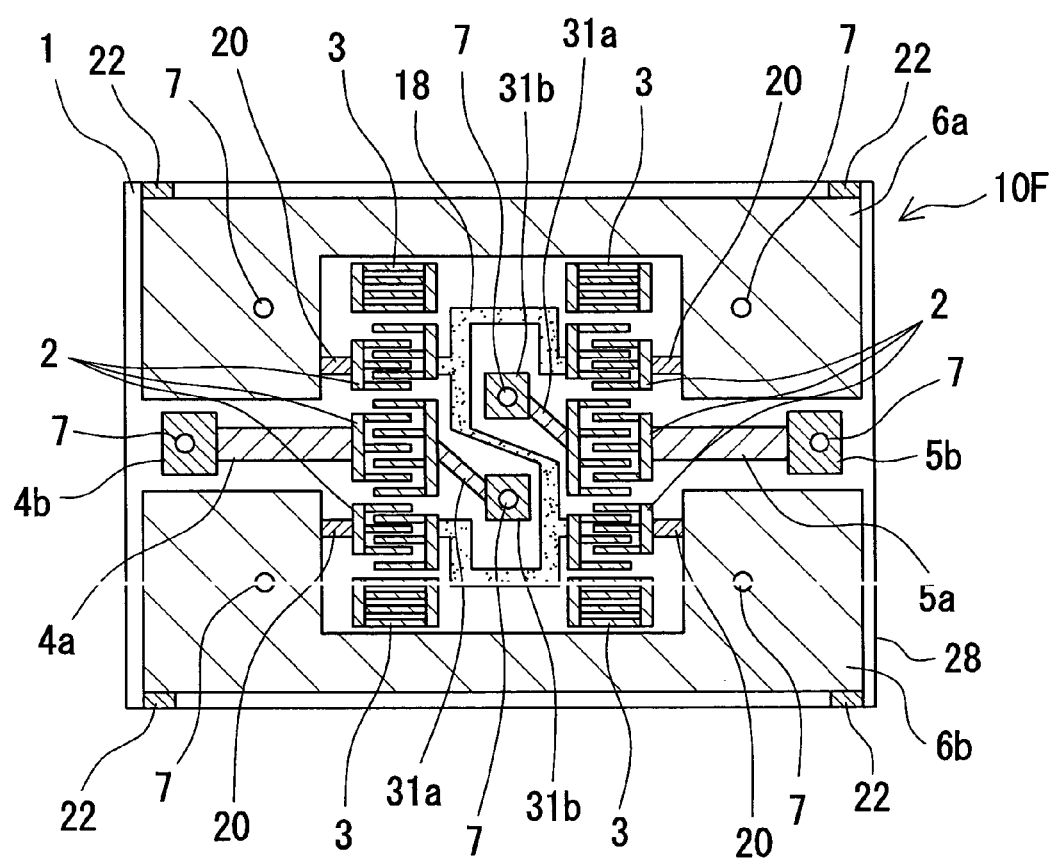
FIG. 10 is a top plan view showing an arrangement of an electrode pattern of a SAW device according to a sixth embodiment of the present invention.

FIG. 10 is a top plan view showing an arrangement of an electrode pattern of a SAW device 10F according to a sixth embodiment of the present invention. In FIG. 10, parts identical with those of FIG. 6 in the fourth embodiment are designated by identical reference numerals and the detailed description is abbreviated for the sake of brevity. Meanwhile, FIG. 10 shows an arrangement of the sixth embodiment schematically and does not illustrate relative ratio of respective dimensions.

FIG. 10 of the sixth embodiment is different from FIG. 6 of the fourth embodiment in that in FIG. 10, the reflector 3 is in an electrically open state relative to the auxiliary electrodes 6a and 6b, the three comb-shaped electrodes 2 are provided for each of input and output terminals such that the two comb-shaped electrodes 2 disposed at opposite ends of the three comb-shaped electrodes 2 not only are connected to each other by the beltlike electrode 18 but are each connected to each of the auxiliary electrodes 6a and 6b electrically by the beltlike electrode 20 and the auxiliary electrodes 6a and 6b are electrically connected to the dicing lines 28 by beltlike electrodes 22.

Namely, in the fourth embodiment, the reflector 3 is in an electrically open state relative to the auxiliary electrodes 6a and 6b, while in the sixth embodiment, the three comb-shaped electrodes 2 are provided for each of input and output terminals such that the two comb-shaped electrodes 2 disposed at opposite ends of the three comb-shaped electrodes 2 not only are each connected to each of the auxiliary electrodes 6a and 6b electrically by the beltlike electrode 20 but are connected to each other by the beltlike electrode 18 and the dicing lines 28 are electrically connected to the auxiliary electrodes 6a and 6b by the beltlike electrodes 22. The SAW device 10F and an electronic component 40F (FIG. 8) are manufactured in the same manner as the fourth embodiment except for the above points.

In FIG. 10, since the dicing lines 28 are electrically connected to the auxiliary electrodes 6a and 6b by the beltlike electrodes 22, electric charge generated in the piezoelectric substrate 1 can be uniformized, as a whole, over the electrodes including the auxiliary electrodes 6a and 6b and the dicing lines 28 so as to equalize potential.

Namely, since the dicing lines 28 are electrically connected to the auxiliary electrodes 6a and 6b by the beltlike electrodes 22, the wider electrodes including the dicing lines 28 can be used as a common electrode, so that the electric charge generated in the piezoelectric substrate 1 can be uniformized over a wider area including the comb-shaped electrodes 2 so as to equalize potential. In addition, by connecting the dicing lines 28 to the auxiliary electrodes 6a and 6b by the wide electrodes, impedance can be lessened in comparison with an electrically open state, so that electrostatic discharge is least likely to happen.

Meanwhile, effects gained by electrically connecting the dicing lines 28 to the auxiliary electrodes 6a and 6b vary according to design of the electrode pattern. If the electrodes capable of uniformizing potential can be connected at low impedance, the electrodes may be linear or planar and the number of the electrodes may be arbitrary. However, it is more effective that the electrodes are desirably planar and the number of the electrodes is large.

Meanwhile, in case the dicing lines 28 are electrically connected to the auxiliary electrodes 6a and 6b by lines, it is not preferable that a high-impedance portion is present in the course of connection paths. Hence, it is desirable that the line width becomes smaller towards an outer peripheral portion. Generally, in design of the electrode pattern, since the dicing lines 28 are made thinnest, it is desirable that the lines for connecting the dicing lines 28 to the auxiliary electrodes 6a and 6b are at least as thin as or thicker than the dicing lines 28.

Therefore, in comparison with the fourth embodiment, since the three comb-shaped electrodes 2 are provided such that the two comb-shaped electrodes 2 disposed at opposite ends of the three comb-shaped electrodes 2, the auxiliary electrodes 6a and 6b and the dicing lines 28 are connected to one another electrically by the beltlike electrodes 18, 20 and 22, the wider electrodes can be used as a common electrode. Hence, since influence of potential exerted by electric charge generated at respective portions can be lessened further, the excellent SAW device 10F can be simply manufactured in which breakdown of the device and deterioration of characteristics due to electrostatic discharge or the like are eliminated.

(Seventh Embodiment)

Figure 11:
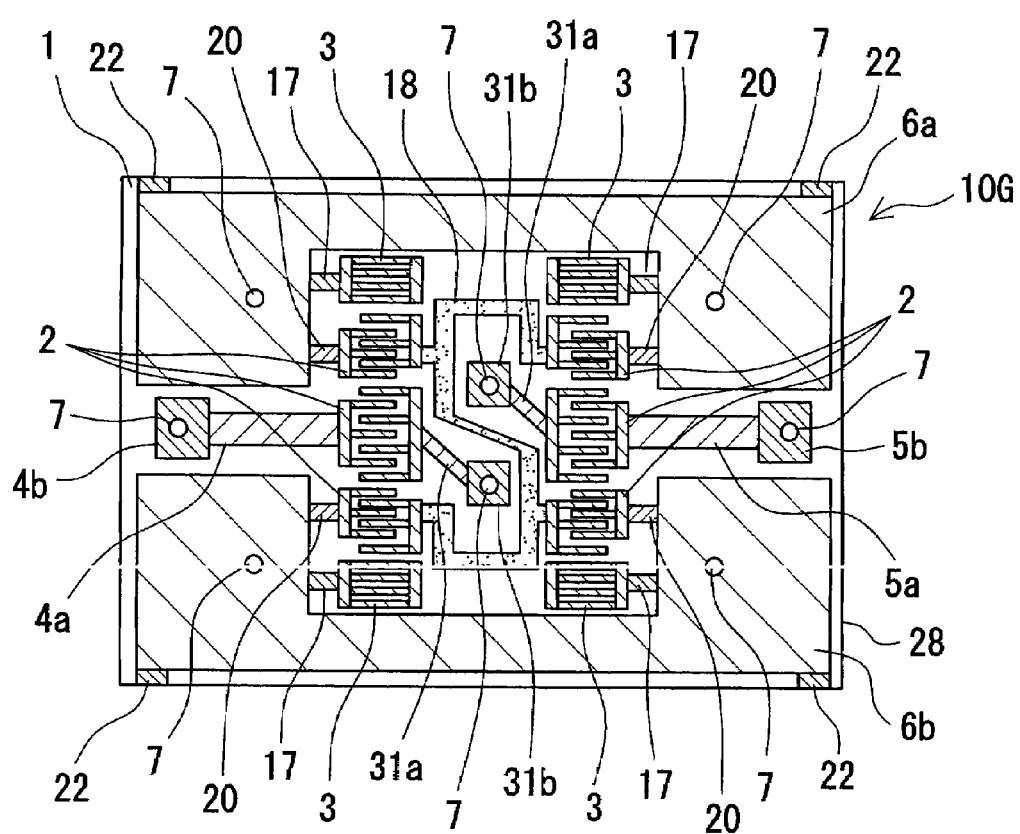
FIG. 11 is a top plan view showing an arrangement of an electrode pattern of a SAW device according to a seventh embodiment of the present invention.

FIG. 11 is a top plan view showing an arrangement of an electrode pattern of a SAW device 10G according to a seventh embodiment of the present invention. In FIG. 11, parts identical with those of FIG. 6 in the fourth embodiment are designated by identical reference numerals and the detailed description is abbreviated for the sake of brevity. Meanwhile, FIG. 11 shows an arrangement of the seventh embodiment schematically and does not illustrate relative ratio of respective dimensions.

FIG. 11 of the seventh embodiment is different from FIG. 6 of the fourth embodiment in that in FIG. 11, the three comb-shaped electrodes 2 are provided for each of input and output terminals such that the two comb-shaped electrodes 2 disposed at opposite ends of the three comb-shaped electrodes 2 not only are each connected to each of the auxiliary electrodes 6a and 6b electrically by the beltlike electrode 20 but are connected to each other by the beltlike electrode 18, the reflector 3 is electrically connected to the auxiliary electrodes 6a and 6b by the beltlike electrodes 17 and the dicing lines 28 are provided outside the comb-shaped electrode 2 and the reflector 3 so as to be electrically connected to the auxiliary electrodes 6a and 6b by the beltlike electrodes 22.

Namely, in the fourth embodiment, the comb-shaped electrode 2, the reflector 3 and the dicing lines 28 are in an electrically open state, while in the seventh embodiment, the dicing lines 28, the auxiliary electrodes 6a and 6b, the two comb-shaped electrodes 2 disposed at the opposite ends of the three comb-shaped electrodes 2 and the reflector 3 are electrically connected to one another by the beltlike electrodes 17, 18, 20 and 22. The SAW device 10G and an electronic component 40G (FIG. 8) are manufactured in the same manner as the fourth embodiment except for the above points.

In FIG. 11, since the dicing lines 28, the auxiliary electrodes 6a and 6b, the two comb-shaped electrodes 2 disposed at the opposite ends of the three comb-shaped electrodes 2 and the reflector 3 are electrically connected to one another by the beltlike electrodes 17, 18, 20 and 22, electric charge generated in the piezoelectric substrate 1 can be uniformized over the whole electrodes including the two comb-shaped electrodes disposed at the opposite ends of the three comb-shaped electrodes 2, the reflector 3, the auxiliary electrodes 6a and 6b and the dicing lines 28 so as to equalize potential.

Namely, since the dicing lines 28, the auxiliary electrodes 6a and 6b, the two comb-shaped electrodes 2 disposed at the opposite ends of the three comb-shaped electrodes 2 and the reflector 3 are electrically connected to one another by the beltlike electrodes 17, 18, 20 and 22, not only electric charge can be uniformized, as a whole, over the wider electrodes including the dicing lines 28, the auxiliary electrodes 6a and 6b, the two comb-shaped electrodes 2 disposed at the opposite ends of the three comb-shaped electrodes 2 and the reflector 3 so as to reduce potential difference but impedance between common electrodes can be lessened in comparison with an electrically open state.

Meanwhile, effects gained by electrically connecting the dicing lines 28, the auxiliary electrodes 6a and 6b, the two comb-shaped electrodes 2 disposed at the opposite ends of the three comb-shaped electrodes 2 and the reflector 3 vary according to design of the electrode pattern. If the electrodes capable of uniformizing potential can be connected at low impedance, the electrodes may be linear or planar and the number of the electrodes may be arbitrary. However, it is more effective that the electrodes are desirably planar and the number of the electrodes is large.

Therefore, in comparison with the fourth embodiment, since the two comb-shaped electrodes 2 disposed at the opposite ends of the three comb-shaped electrodes 2, the reflector 3, the auxiliary electrodes 6a and 6b and the dicing lines 28 are electrically connected to one another, the wider electrodes can be used as a common electrode. Hence, since potential difference produced at respective portions can be lessened further, the excellent SAW device 10G can be simply manufactured in which breakdown of the device and deterioration of characteristics due to electrostatic discharge or the like are eliminated.

(Eighth Embodiment)

Figure 12:
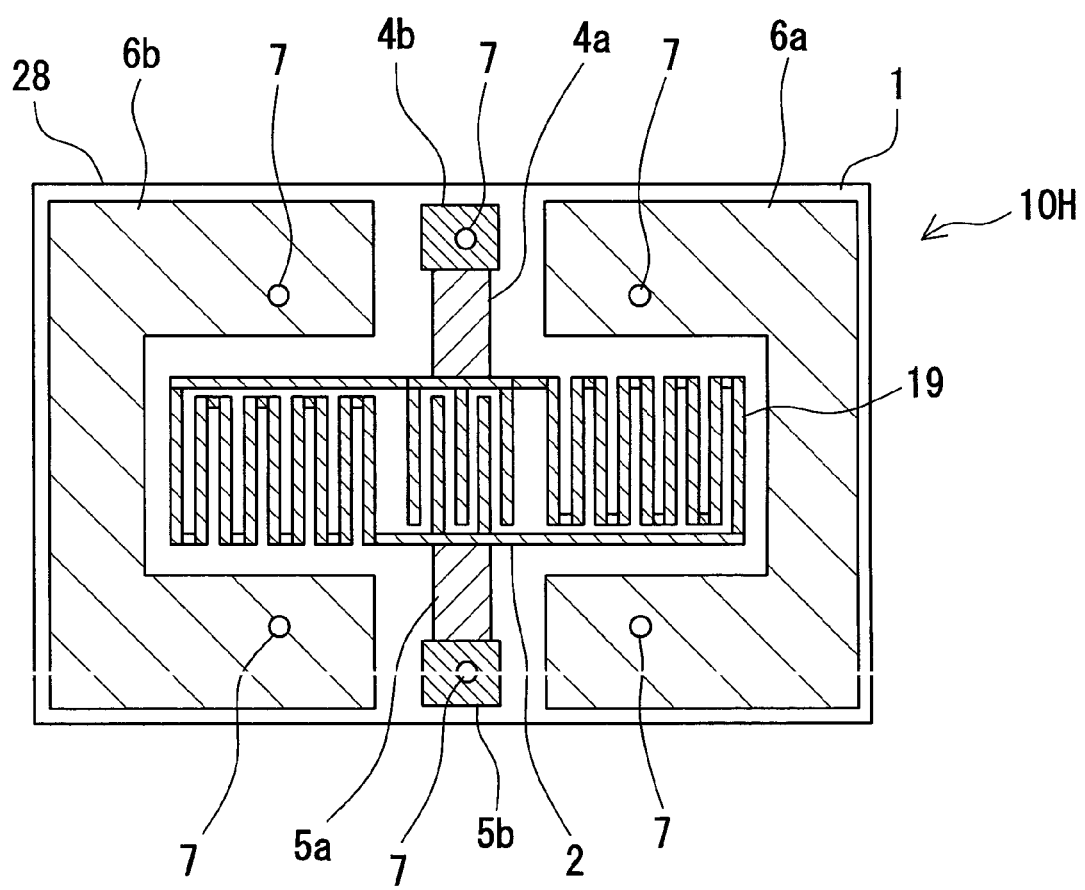
FIG. 12 is a top plan view showing an arrangement of an electrode pattern of a SAW device according to an eighth embodiment of the present invention.

FIG. 12 is a top plan view showing an arrangement of an electrode pattern of a SAW device 10H according to an eighth embodiment of the present invention. In FIG. 12, parts identical with those of FIG. 6 in the fourth embodiment are designated by identical reference numerals and the detailed description is abbreviated for the sake of brevity. Meanwhile, FIG. 12 shows an arrangement of the eighth embodiment schematically and does not illustrate relative ratio of respective dimensions.

FIG. 12 of the eighth embodiment is different from FIG. 6 of the fourth embodiment in that in FIG. 12, the reflector is formed by a meander line and is electrically connected to the comb-shaped electrode 2.

Namely, in the fourth embodiment, the comb-shaped electrode 2 and the reflector 3 are in an electrically open state, while in the eighth embodiment, the comb-shaped electrode 2 and the reflector 19 formed by the meander line are electrically connected to each other and the dicing lines 28 are provided outside the auxiliary electrodes 6a and 6b. The SAW device 10H and an electronic component 40H (FIG. 8) are manufactured in the same manner as the fourth embodiment except for the above points.

In FIG. 12, the reflector 19 formed by the meander line is electrically connected to the comb-shaped electrode 2 and signals in use are transmitted therebetween in DC or at low frequencies. However, in a high-frequency band for operating the SAW device 10H, impedance of the meander line rises and thus, the meander line is substantially set in an open state relative to the comb-shaped electrode 2.

Meanwhile, since a common electrode portion can be enlarged by electrically connecting the comb-shaped electrode 2 and the reflector 19 formed by the meander line, electric charge generated by pyroelectric property of the piezoelectric substrate 1 can be uniformized over a wider electrode or a longer electrode as a whole, so that potential difference produced at respective portions can be lessened.

Namely, since the reflector 19 formed by the meander line is electrically connected to the comb-shaped electrode 2, the reflector 19 and the comb-shaped electrode 2 are set in a substantially open state at operating frequency so as to not only eliminate malfunctions but enlarge an electrically connected common electrode portion, so that electric charge generated in the piezoelectric substrate 1 can be uniformized over the whole electrodes including the reflector 19 and the comb-shaped electrode 2 so as to equalize potential.

Meanwhile, the auxiliary electrodes 6a and 6b and the dicing lines 28 may be electrically connected to each other by at least one linear or beltlike electrode such that a common electrode for uniformizing produced potential is further enlarged.

Therefore, in comparison with the fourth embodiment, since the reflector 19 formed by the meander line is electrically connected to the comb-shaped electrode 2, the reflector 19 and the comb-shaped electrode 2 are set in a substantially open state at operating frequency so as to not only eliminate malfunctions but enlarge an electrically connected common electrode portion, so that electric charge generated in the piezoelectric substrate 1 can be uniformized over the whole electrodes including the reflector 19 and the comb-shaped electrode 2 so as to equalize potential. Hence, since potential difference produced at respective portions can be lessened further, the excellent SAW device 10H can be simply manufactured in which breakdown of the device and deterioration of characteristics due to electrostatic discharge or the like are eliminated.

In accordance with the first to third embodiments of the present invention as is clear from the foregoing description, since the comb-shaped electrode and the reflector are surrounded by the auxiliary electrodes, potential produced by pyroelectric property of the piezoelectric substrate can be uniformized more rapidly and more simply even after the wafer has been cut into a plurality of the SAW devices, so that the excellent SAW device can be manufactured simply in which breakdown of the device and deterioration of characteristics due to electrostatic discharge or the like are eliminated.

Meanwhile, in accordance with the fourth to eighth embodiments of the present invention, since the comb-shaped electrode and the reflector are surrounded by the auxiliary electrodes inside the dicing lines, potential produced by pyroelectric property of the piezoelectric substrate can be uniformized more rapidly and more simply even after the wafer has been cut into a plurality of the SAW devices, so that the excellent SAW device can be manufactured simply in which breakdown of the device and deterioration of characteristics due to electrostatic discharge or the like are eliminated.

What is claimed is:

1. A surface acoustic wave (SAW) device comprising:
   first and second comb-shaped electrodes which are provided axially opposite to each other on a piezoelectric substrate;
   a pair of first reflectors and a pair of second reflectors which are provided, on the piezoelectric substrate, at opposite sides of the first comb-shaped electrode along propagation direction of a surface wave generated from the first comb-shaped electrode and at opposite sides of the second comb-shaped electrode along a propagation direction of a surface wave generated from the second comb-shaped electrode, respectively, and are electrically isolated from the first and second comb-shaped electrodes, respectively; and
   a plurality of auxiliary electrodes for surrounding the first and second comb-shaped electrodes, the pair of first reflectors and the pair of second reflectors, which are electrically independent of each other and have different widths locally.

2. A SAW device as claimed in claim 1, wherein the auxiliary electrodes are each used as a ground electrode.

3. A SAW device as claimed in claim 1, wherein the auxiliary electrodes are disposed substantially equivalently.

4. A SAW device as claimed in claim 1, further comprising:
   a beltlike input terminal lead-out electrode connected to the first comb-shaped electrode and a beltlike output terminal lead-out electrode connected to the second comb-shaped electrode;
   an input terminal electrode which is connected to the input terminal lead-out electrode; and
   an output terminal electrode which is connected to the output terminal lead-out electrode.

5. A SAW device as claimed in claim 4, wherein the input terminal lead-out electrode and the output terminal lead-out electrode are symmetric about a central axis between the first and second comb-shaped electrodes and are made substantially equal in area, and the input terminal electrode and the output terminal electrode are symmetric about a central axis between the first and second comb-shaped electrodes and are made substantially equal in area.

6. A SAW device as claimed in claim 1, wherein at least a portion of the reflectors is electrically connected to the auxiliary electrodes.

7. A SAW device as claimed in claim 6, wherein each reflector is electrically connected to one of the auxiliary electrodes by a linear or beltlike electrode.

8. A SAW device as claimed in claim 1, wherein the reflectors are set in an electrically open state relative to the auxiliary electrodes.

9. A surface acoustic wave (SAW) device comprising:
   a comb-shaped electrode which is provided on a piezoelectric substrate;
   a pair of reflectors which are provided, on the piezoelectric substrate, at opposite sides of the comb-shaped electrode along a propagation direction of a surface wave generated from the comb-shaped electrode;
   a plurality of auxiliary electrodes for surrounding the comb-shaped electrode and the pair of reflectors, which are electrically independent of each other and have different widths locally;
   a beltlike input terminal lead-out electrode and a beltlike output terminal lead-out electrode which are each connected to the comb-shaped electrode;
   an input terminal electrode which is connected to the input terminal lead-out electrode; and
   an output terminal electrode which is connected to the output terminal lead-out electrode,
   wherein each reflector is formed by a meander line and is electrically connected to the comb-shaped electrode, and
   wherein the input terminal lead-out electrode and the output terminal lead-out electrode are symmetric and are made substantially equal in area, and the input terminal electrode and the output terminal electrode are symmetric and are made substantially equal in area.

10. An electronic component comprising:
    a) a surface acoustic wave (SAW) device including:
       first and second comb-shaped electrodes which are provided axially opposite to each other on a piezoelectric substrate,
       a pair of first and a pair of second reflectors which are provided, on the piezoelectric substrate, at opposite sides of the first comb-shaped electrode along a propagation direction of a surface wave generated from the first comb-shaped electrode and at opposite sides of the second comb-shaped electrode along a propagation direction of a surface wave generated from the second comb-shaped electrode, respectively, and are electrically isolated from the first and second comb-shaped electrodes, respectively,
       a plurality of auxiliary electrodes for surrounding the first and second comb-shaped electrodes, the pair of first reflectors and the pair of second reflectors, which are electrically independent of each other and have different widths locally,
       a beltlike input terminal lead-out electrode connected to the first comb-shaped electrode and a beltlike output terminal lead-out electrode connected to the second comb-shaped electrode,
       an input terminal electrode electrically connected to the input terminal lead-out electrode and
       an output terminal electrode electrically connected to the output terminal lead-out electrode; and
    b) a base member which has the SAW device mounted thereon and is sealed.

11. An electronic component comprising:
    a) a surface acoustic wave (SAW) device including:
       a comb-shaped electrode which is provided on a piezoelectric substrate;
       a pair of reflectors which are provided, on the piezoelectric substrate, at opposite sides of the comb-shaped electrode along a propagation direction of a surface wave generated from the comb-shaped electrode;

a plurality of auxiliary electrodes for surrounding the comb-shaped electrode and the pair of reflectors, which are electrically independent of each other and have different widths locally;

a beltlike input terminal lead-out electrode and a beltlike output terminal lead-out electrode which are each connected to the comb-shaped electrode;

an input terminal electrode which is connected to the input terminal lead-out electrode; and an output terminal electrode which is connected to the output terminal lead-out electrode, wherein each reflector is formed by a meander line and is electrically connected to the comb-shaped electrode, and the input terminal lead-out electrode and the output terminal lead-out electrode are symmetric and are made substantially equal in area, and the input terminal electrode and the output terminal electrode are symmetric and are made substantially equal in area; and b) a base member which has the SAW device mounted thereon is sealed.

* * * * *